United States Patent
Park et al.

(10) Patent No.: US 9,029,785 B2
(45) Date of Patent: May 12, 2015

(54) METHOD OF FABRICATING MICROLENS, AND DEPTH SENSOR INCLUDING MICROLENS

(75) Inventors: Doo Cheol Park, Hwaseong-Si (KR); Seung Hyuk Chang, Seongmam-Si (KR); Myung-Sun Kim, Seoul (KR); Won Joo Kim, Hwaseong-Si (KR); Ju Hwan Jung, Seoul (KR); Seung Hoon Lee, Yongin-Si (KR); Kwang-Min Lee, Seoul (KR); Hyoung Soo Ko, Hwaseong-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 467 days.

(21) Appl. No.: 13/407,879

(22) Filed: Feb. 29, 2012

(65) Prior Publication Data
US 2012/0224028 A1  Sep. 6, 2012

(30) Foreign Application Priority Data
Mar. 3, 2011 (KR) ........................ 10-2011-0019001

(51) Int. Cl.
| | |
|---|---|
| G02B 13/00 | (2006.01) |
| G02B 3/00 | (2006.01) |
| G02B 13/14 | (2006.01) |
| G03F 7/40 | (2006.01) |
| G02B 23/14 | (2006.01) |

(52) U.S. Cl.
CPC ............ *G02B 3/0018* (2013.01); *G02B 3/0056* (2013.01); *G02B 13/14* (2013.01); *G02B 23/14* (2013.01); *G03F 7/40* (2013.01)

(58) Field of Classification Search
USPC ............ 250/363.01, 363.02, 363.03, 370.01; 257/432; 356/3, 4.01, 5.01
See application file for complete search history.

(56) References Cited

U.S. PATENT DOCUMENTS

| | | | |
|---|---|---|---|
| 2006/0119950 A1* | 6/2006 | Boettiger et al. | ............. 359/626 |
| 2006/0145176 A1 | 7/2006 | Lee | |
| 2009/0001257 A1 | 1/2009 | Hwang | |

FOREIGN PATENT DOCUMENTS

| | | |
|---|---|---|
| JP | 2007-158312 | 6/2007 |
| KR | 20060077670 A | 7/2006 |
| KR | 100871793 B1 | 12/2008 |

* cited by examiner

*Primary Examiner* — Mark R Gaworecki
(74) *Attorney, Agent, or Firm* — Volentine & Whitt, PLLC

(57) ABSTRACT

A method of fabricating a microlens includes forming layer of photoresist on a substrate, patterning the layer of photoresist, and then reflowing the photoresist pattern. The layer of photoresist is formed by coating the substrate with liquid photoresist whose viscosity is 150 to 250 cp. A depth sensor includes a substrate and photoelectric conversion elements at an upper portion of the substrate, a metal wiring section disposed on the substrate, an array of the microlenses for focusing incident light as beams onto the photoelectric conversion elements and which beams avoid the wirings of the metal wiring section. The depths sensor also includes a layer presenting a flat upper surface on which the microlenses are formed. The layer may be a dedicated planarization layer or an IR filter, interposed between the microlenses and the metal wiring section.

12 Claims, 9 Drawing Sheets

METHOD OF FABRICATING MICROLENS, AND DEPTH SENSOR INCLUDING MICROLENS

PRIORITY STATEMENT

This application claims priority under 35 U.S.C. §119(a) from Korean Patent Application No. 10-2011-0019001 filed on Mar. 3, 2011, the disclosure of which is hereby incorporated by reference in its entirety.

BACKGROUND

The inventive concept relates to range finding and/or range imaging and more particularly, to depth sensors of range finders and/or range imaging cameras such as time-of-flight (TOF) cameras. The inventive concept also relates to microlenses and to a method of fabricating the same.

Range finding is a technique of measuring the distance to a target without using physical means to do so, and range imaging is a technique used to produce an image of a scene. Typical range imaging cameras, for example, include an illumination system for illuminating a subject, such as a person, and depth pixels for collecting light reflected from the subject and producing data representative of an image of the subject. A time-of-flight camera (TOF camera) is a range imaging system that has the ability to produce a 3-D image of a scene. To this end, the depth sensor of a TOF camera may include a light source for illuminating the subject (the scene), and depth pixels which receive light reflected from the subject and generate photons in response to incident light. The photons are sensed to provide information on the distance between the camera and the subject. That is, the generation of the photons allows the time of flight of the light to be measured, and the distance between the subject and the camera can be calculated based on the time of flight and the known speed of light. Thus, the performance of a depth sensor is crucial to the precise calculation of the distance between the camera and the subject and/or is crucial to the quality of the image of the subject that can be produced.

SUMMARY

According to an aspect of the inventive concept, there is provided a method of fabricating a microlens, the method comprising: forming a layer of photoresist on a substrate including by coating the substrate with liquid photoresist whose viscosity is 150 cp to 250 cp, patterning the layer of photoresist to form a photoresist pattern, and reflowing the photoresist pattern.

According to a similar aspect of the inventive concept, there is provided a microlens formed by forming a layer of photoresist on a substrate including by coating the substrate with liquid photoresist whose viscosity is 150 cp to 250 cp, patterning the layer of photoresist to form a photoresist pattern, and reflowing the photoresist pattern.

According to another aspect of the inventive concept, there is provided a depth pixel comprising: a microlens of photoresist that focuses rays of light incident thereon, and a photoelectric element that converts light received thereby to electric charges. The photoelectric element is positioned relative to the microlens so as to receive rays of light incident on and focused by the microlens.

According to still another aspect of the inventive concept, there is provided a depth sensor comprising: an array of depth pixels, and a processor operatively connected to the array of depth pixels. Each of the depth pixels of the array includes a microlens of photoresist that focuses rays of light incident thereon, and a photoelectric element that converts light received thereby to electric charges. Furthermore, each photoelectric element of the array is positioned relative to a respective microlens in the array so as to receive rays of light incident on and focused by the respective microlens. The processor is configured to calculate a distance between a target and the depth sensor based on signals output by the array of depth pixels. The distance may be used to produce a 3D image of the target.

BRIEF DESCRIPTION OF THE DRAWINGS

The above and other features and advantages of the inventive concept will become more apparent from the detailed description of the preferred embodiments thereof that follows as made with reference to the attached drawings in which.

DETAILED DESCRIPTION OF THE PREFERRED EMBODIMENTS

Various embodiments and examples of embodiments of the inventive concept will be described more fully hereinafter with reference to the accompanying drawings. Like numerals are used to designate like elements throughout the drawings.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes.

A method of fabricating a microlens according to the inventive concept will now be described with reference to FIGS. 1A through 1C, and 4. In general, a microlens is any small lens whose diameter is less than a millimeter (mm).

Figure 1A:
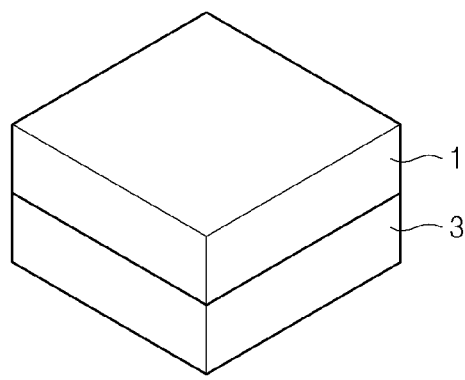
FIGS. 1A through 1C are perspective views of stages, respectively, in a method of fabricating a microlens according to the inventive concept.
Figure 4:
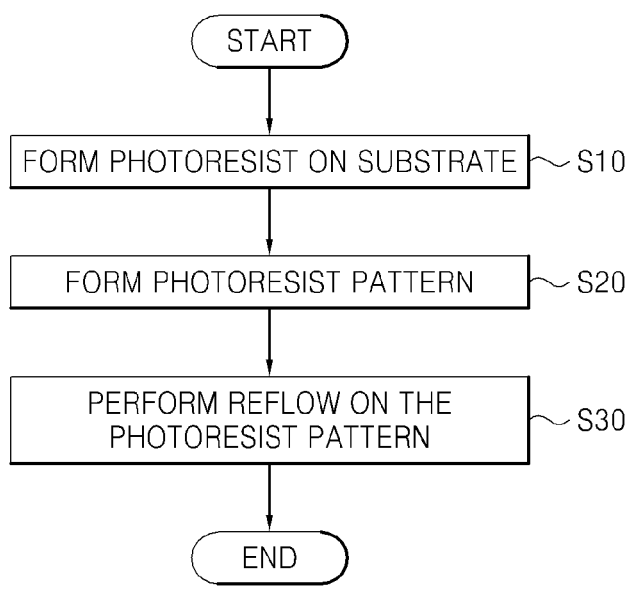
FIG. 4 is a flowchart of the method of fabricating a microlens according to the inventive concept.

Referring to FIGS. 1A and 4, a layer of photoresist 1 is formed on a substrate 3 (S10). The layer of photoresist 1 has a thickness of 0.1 μm to 9.9 μm. To this end, the substrate 3 is coated (e.g., by spin coating) with liquid photoresist. The viscosity of the photoresist is 150 cp to 250 cp at the time the photoresist is caused to reflow (as described below).

Figure 1B:
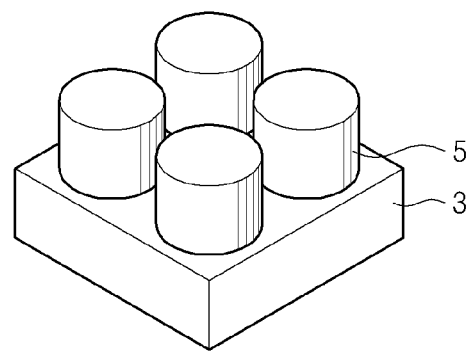
Figure 1C:
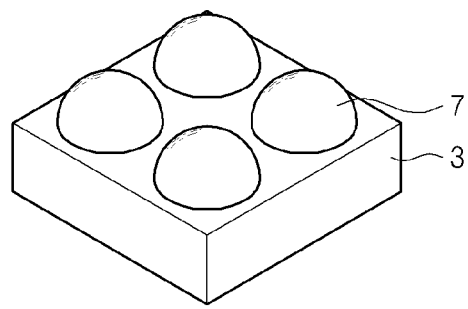

Referring to FIGS. 1B and 4, the layer of photoresist 1 is then exposed and developed to form a photoresist pattern 5 (S20). In this embodiment, the photoresist pattern 5 comprises one or more cylindrical members each having a diameter of 10 μm to 99 μm. For example, the photoresist pattern 5 is a 2-dimensional array (rows and columns) of cylindrical members each having substantially the same diameter within a range of 10 μm to 99 μm, and the same height. Referring to FIGS. 1C and 4, the photoresist pattern 5 is then subjected to a thermal reflow process (e.g., by curing) which melts the photoresist pattern 5 (S30). As a result, each cylindrical member is transformed into a microlens 7. For example, after the reflow process, the height of each microlens ranges from 0.1 µm±0.01 µm to 9.9 µm±0.01 µm. The thickness of each microlens ranges from 10 µm±1 µm to 99±1 µm.

One embodiment of a depth sensor 10, having microlenses, according to the inventive concept will now be described with reference to FIG. 2.

The depth sensor 10 comprises a semiconductor chip 20, a light source 32, and a lens module 34. The semiconductor chip 20 of this example includes an array 22 of depth pixels 50, a row decoder 24, a timing controller 26, a photo gate controller 28, a light source driver 30, and a logic circuit 36.

The row decoder 24 selects one row from among the plurality of rows of the depth pixels 50 in response to a row address output from the timing controller 26.

The photo gate controller 28 generates a plurality of photo gate control signals and provides them to the array 22 under the control of the timing controller 26.

The light source driver 30 generates a clock signal MLS for driving the light source 32 under the control of the timing controller 26. The light source driver 30 also provides the clock signal MLS or information about the clock signal MLS to the photo gate controller 28.

The light source 32 emits a modulated optical signal toward a target 40 in response to the clock signal MLS. The light source 32 may comprise a light emitting diode (LED), an organic light emitting diode (OLED), or a laser diode. The form of the modulated optical signal may be that of a sine wave or a square wave. In FIG. 2 the light source 32 is illustrated for the sake of simplicity as having only one light emitting element, but the light source 32 includes a plurality of light emitting elements arranged in circle around the lens module 34.

The logic circuit 36 processes signals output by the plurality of depth pixels 50 in the array 22 and outputs the processed signals to a processor under the control of the timing controller 26. The processor may be a chip separate from that of the semiconductor chip 10. Furthermore, the depth sensor 10 and the processor may be an integral unit regardless of whether the processor is part of the chip 20, i.e., the depth sensor 10 and processor may be a range imaging camera. In any case, using the processed signals, the processor may calculate the distance between the depth sensor 10 and the target 40 based on the time-of-flight principle. Thus, the processor and the depth sensor 10 may constitute a TOF camera.

In one example of this embodiment, the logic circuit 36 includes an analog-to-digital converter which converts signals output from the array 22 into digital signals. The logic circuit 36 may also include a correlated doubling sampling (CDS) block (not shown) which performs CDS on the digital signals output from the analog-to-digital converter. Alternatively, the logic circuit 36 may include a CDS block (not shown) which performs CDS on the signals output from the array 22 and an analog-to-digital converter which converts CDS signals output from the CDS block into digital signals. The logic circuit 36 may also include a column decoder which transmits signals output by the analog-to-digital conversion block or the CDS block to the processor under the control of the timing controller 26.

The modulated optical signal emitted by the light source 32 is reflected from the target 40. Reflected optical signals are input to the array 22 through the lens module 34.

When the target is three-dimensional, there are different distances $Z_1$, $Z_2$, and $Z_3$ between the depth sensor 10 and the target 40. In this case, a distance Z (in particular, the distance between the light source 32 or the array 22 and the target 40) may be calculated as follows according to a TOF principle when the modulated optical signal has a waveform of cos ωt, and using a selected one 23 of the depth pixels 50.

The reflected optical signal is received by the depth pixel 23, and the depth pixel 23 as a result outputs an optical signal having a waveform of cos(ωt+Φ), wherein (Φ) is the phase difference between the optical signals output by the light source 32 and the depth pixel 23. This phase difference (Φ)=2*ω*Z/C=2*(2πf)*Z/C, wherein C is the speed of light, π it is the wavelength of the light emitted by the light source 32 and f is the frequency of the light. Accordingly, the distance Z=Φ*C/(2*ω)=Φ*C/(2*(2πf)).

In this way, the optical signals input to the array 22 through the lens module 34 may be demodulated by the plurality of depth pixels 50. In other words, the optical signals input to the array 22 through the lens module 34 are used to form an image of the target 40.

Figure 3:
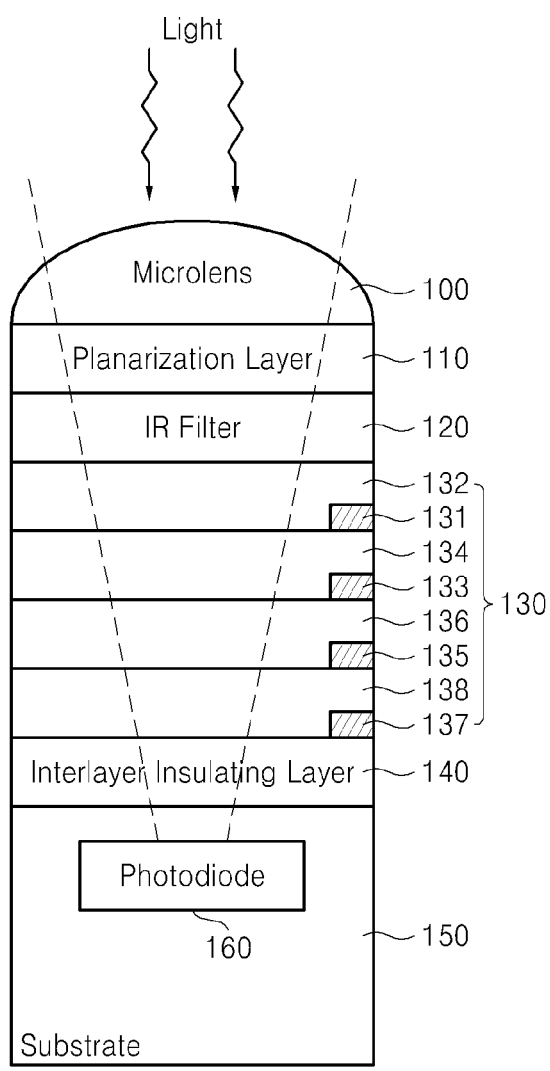
FIG. 3 is a schematic cross-sectional view of a depth pixel of the depth sensor of FIG. 2.

An individual depth pixel, namely depth pixel 23, will now be described in more detail with reference to FIG. 3. It should be noted, however, that the various layers shown in FIG. 3 are used in common in the array 22.

The depth pixel 23 includes a microlens 100, an optional planarization layer 110, an infrared (IR) filter 120, a wiring section 130, an interlayer insulating layer 140, a substrate 150, and a photoelectric conversion element 160.

In the illustrated example, the microlens 100 is formed on the planarization layer 110 using photoresist in the manner described above with reference to FIGS. 1A-1C and 4. In the array 22, an array of the microlenses 100 are provided on the planarization layer 110. The planarization layer 110 thus corresponds to substrate 3 and provides a smooth and flat surface (its upper surface) on which the microlens 100 is formed. The planarization layer 110 may be of an acrylic or epoxy material. Alternatively, the planarization layer 110 may be omitted, and the microlens may be formed on the upper surface of the IR filter 120 in the case in which that surface is smooth or polished.

As mentioned above, when the viscosity of the photoresist is 150 cp to 250 cp, a relatively thick layer of photoresist (0.1 µm to 9.9 µm thick) can be formed on the planarization layer 110 or IR filter 120. The microlens 100 can be relatively large when it is formed from such a layer of photoresist having a thickness of 0.1 µm to 9.9 µm. The significance of this resides in the fact that a depth pixel of a depth sensor is generally much larger than that of a typical pixel of an image sensor. Accordingly, the inventive concept can provide a microlens for use in the depth sensor.

Light passing through and focused by the microlens 100 is received by the IR filter 120. The IR filter 120 transmits only that part of the light having wavelengths in the IR spectrum.

The wiring section 130 includes a plurality of dielectric layers 132, 134, 136, and 138 and a plurality of metal wirings 131, 133, 135, and 137. Each of the dielectric layers 132, 134, 136, and 138 may be an oxide layer or a composite layer of an oxide film and a nitride film.

The metal wirings 131, 133, 135, and 137 are connected with power or signal lines. Also, the metal wirings 131, 133, 135, and 137 may be connected to each other by vias extending through the dielectric layers 134, 136, and 138. The microlens 100 serves to focus the light away from the metal wirings 131, 133, 135, and 137 so that the majority of the light is incident on the substrate (as shown by the chained lines in FIG. 3).

The interlayer insulating layer 140 may be of silicon nitride, silicon oxide, or an acrylic resin. The interlayer insulating layer 140 may cover transistors (e.g., transfer transistors) on the substrate 150.

The substrate 150 may be of silicon (Si), silicon germanium (SiGe), or germanium (Ge). The photoelectric conversion element 160 is integrated with the substrate 150 and is generally formed at the upper surface of the substrate. For instance, the photoelectric conversion element 160 may be a photodiode or a photogate which generates photocharges in response to IR rays incident thereon. In the array 22, a plurality of the photoelectric conversion elements 160 are provided across the substrate 150, and each microlens 100 focuses the light onto a respective photoelectric conversion element 160 while avoiding the metal wirings 131, 133, 135, and 137 that run across the dielectric layers 134, 136, and 138.

Figure 2:
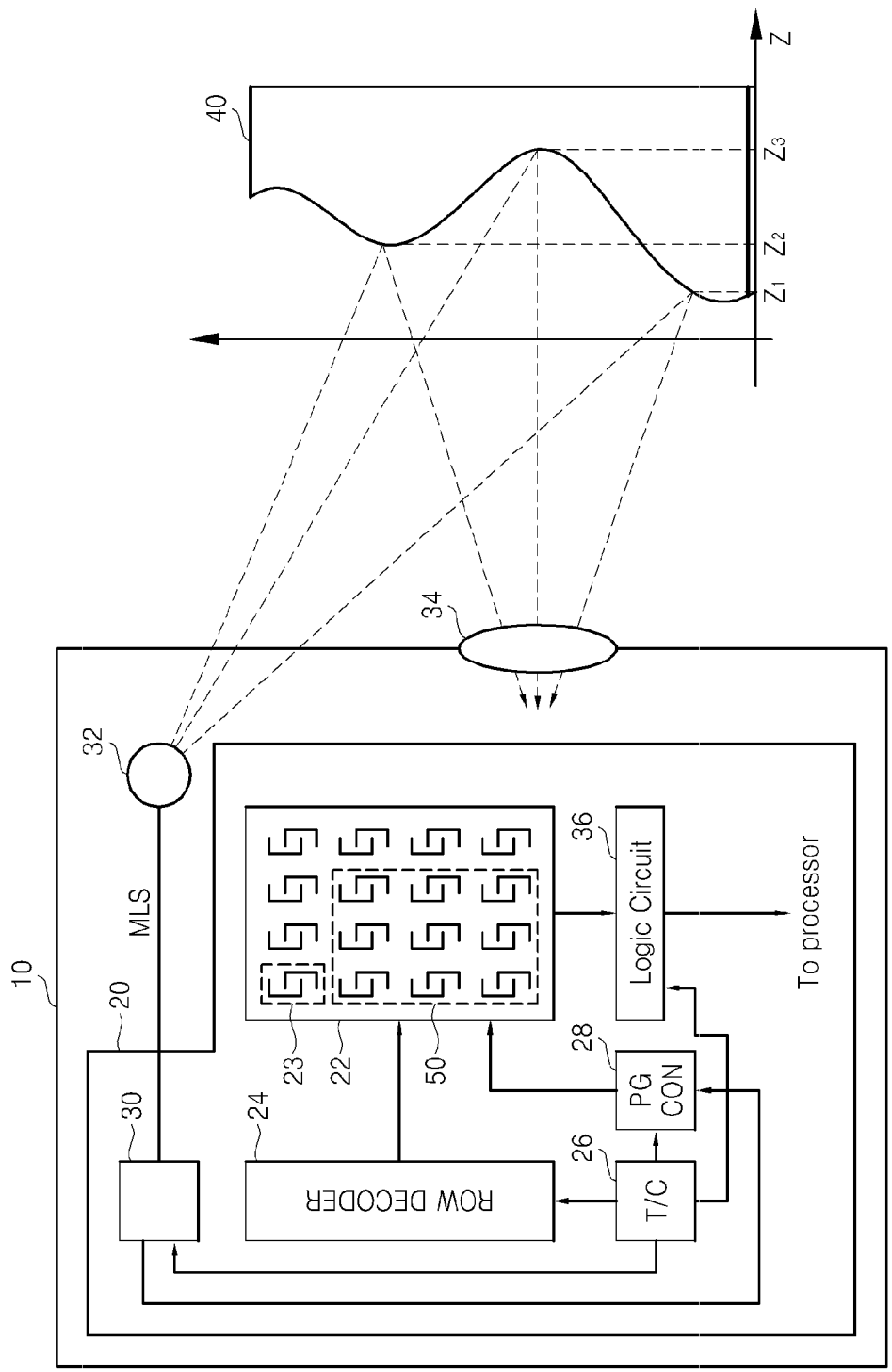
FIG. 2 is a block diagram of a depth sensor including a microlens according to the inventive concept.
Figure 5:
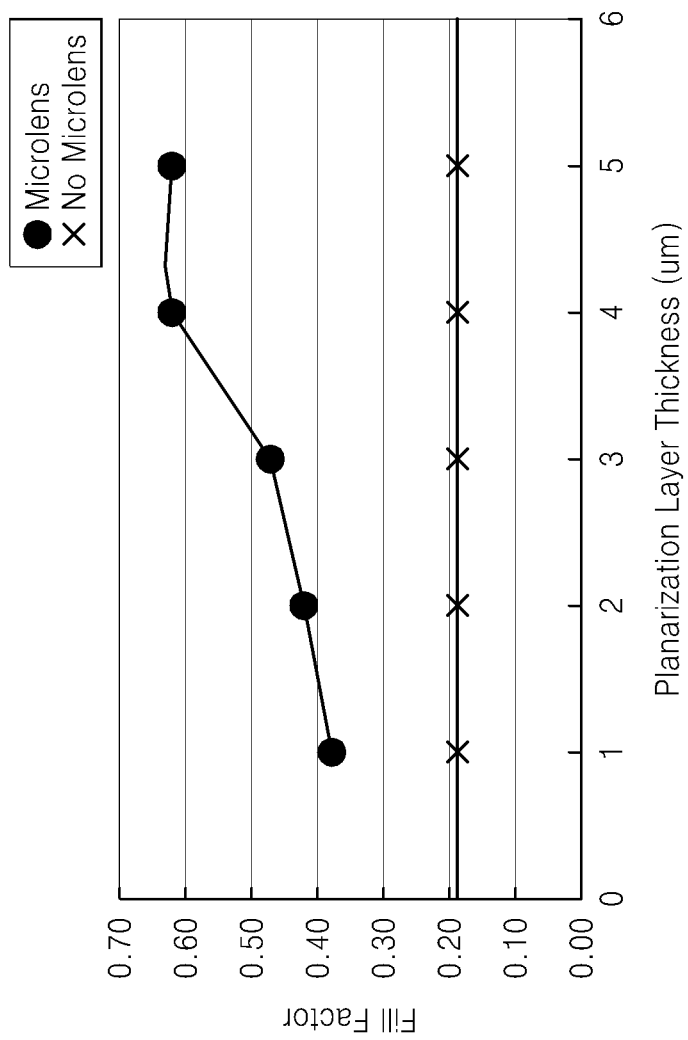
FIG. 5 is a graph of result of simulations conducted using a conventional depth sensor and a depth sensor according to the inventive concept.

FIG. 5 shows the results of simulations conducted using a conventional depth sensor and the depth sensor 10 illustrated in FIG. 2. The conventional depth sensor is similar to that of FIG. 2 but does not include a microlens. That is, in the conventional depth sensor, the upper surface of the planarization layer is exposed to receive the incident light.

As the results of FIG. 5 show, the conventional depth sensor has a fill factor of 0.18% irrespective of the thickness of the planarization layer. On the other hand, the depth sensor 10 has a fill factor that increases as the thickness of the planarization layer increases.

Furthermore, when the thicknesses of the planarization layers are 1 μm, the depth sensor 10 has a fill factor two times greater than that of the conventional depth sensor. When the thicknesses of the planarization layers are 4 μm, the depth sensor 10 has a fill factor three times greater than that of the conventional depth sensor. Thus, it can be seen that the microlens 100 provides the depth sensor 10 with increased performance.

Figure 6:
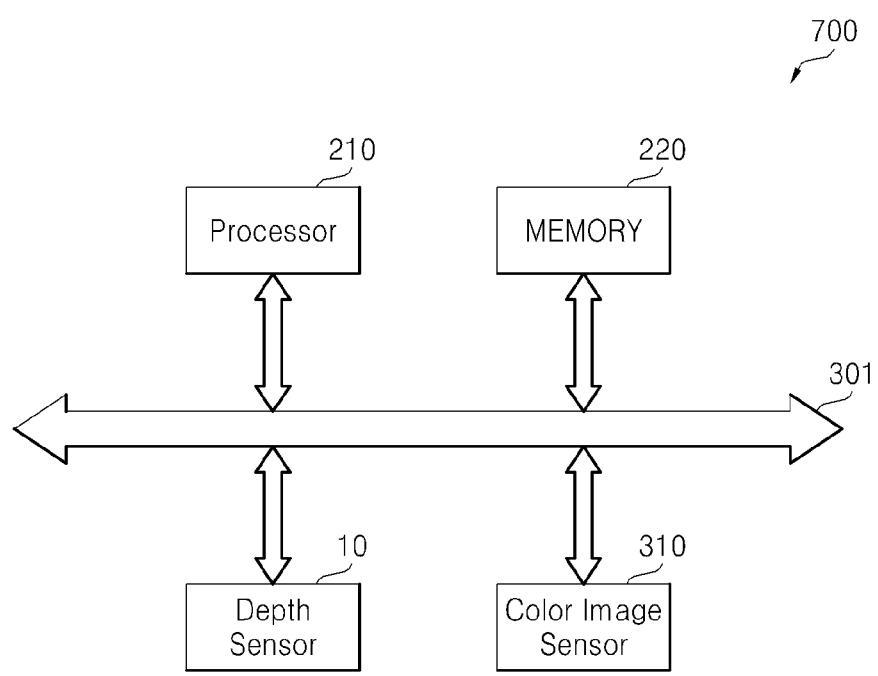
FIG. 6 is a block diagram of an image processing system including a color image sensor and a depth sensor according to inventive concept.

An example of an image processing system 700 according to the inventive concept will now be described with reference to FIG. 6. The image processing system 700 may be employed by a 3D range finder, a game controller, a camera, or an image (gesture) recognition device.

The image processing system 700 includes a color image sensor 310, a depth sensor 10 (FIG. 2), a processor 210, and a memory 220 connected through a bus 301. Note, although the depth sensor 10 and the color image sensor 310 are illustrated in FIG. 6 as physically separate components, this is just for the sake of clarity, and the depth sensor 10 and the color image sensor 310 may be embodied as an integrated component having common signal processing circuitry.

In this example of the image processing system 700, the color image sensor 310 includes a pixel array which includes a red pixel, a green pixel, and a blue pixel but does not include a depth pixel. Accordingly, the processor 210 may generate three-dimensional (3D) image information based on depth (range) information output by the depth sensor 10 and color information (e.g., at least one of red, green, blue, magenta, cyan, and yellow color information) output by the color image sensor 310. The 3D image information generated by the processor 210 can be stored in the memory device 220. The image processing system 700 may also include a display (not shown) on which the 3D image information is displayed.

Figure 7:
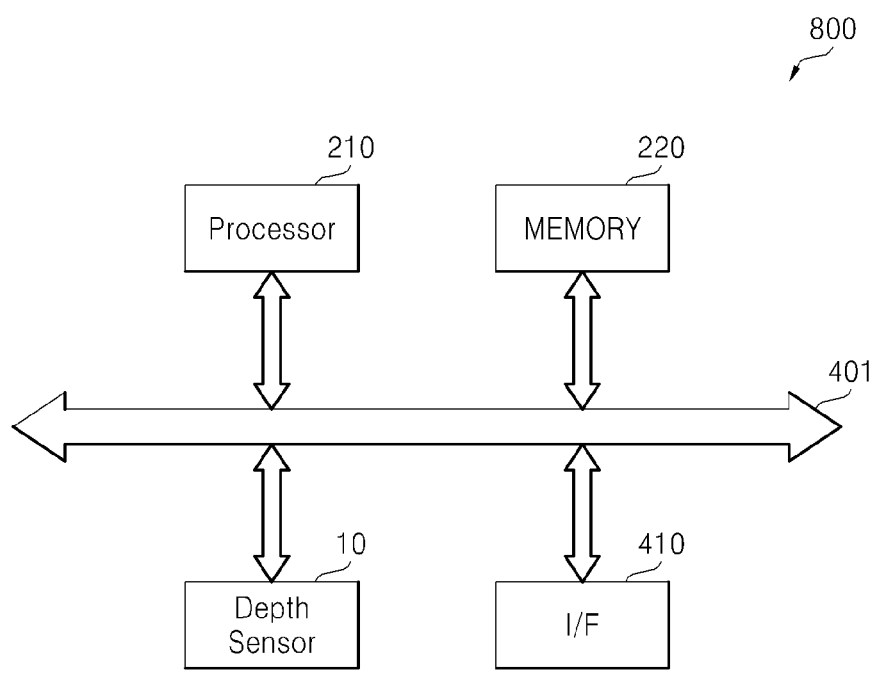
FIG. 7 is a block diagram of a signal processing system including a depth sensor according to the inventive concept.

An example of a signal processing system 800 according to the inventive concept will now be described with reference to FIG. 7.

The signal processing system 800, which simply functions as a range finder, includes a depth sensor 10 (FIG. 2), a processor 210 controlling the operations of the depth sensor 10, a memory device 220 and an interface (I/F) 410 connected to one another through a bus 401.

The processor 210 calculates the distance between the signal processing system 800 and an object (target) based on depth information output by the depth sensor 10. The distance calculated by the processor 210 can be stored in the memory device 220. The interface (I/F) 410 may input user information and output the distance information. The I/F 410 may be a wireless interface.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A depth pixel comprising:
a convex microlens consisting of photoresist that focuses rays of light incident thereon, wherein the height of the microlens is in a range of 0.1 μm±0.01 μm to 9.9 μm±0.01 μm; and
a photoelectric element that converts light received thereby to electric charges, the photoelectric element being positioned relative to the microlens so as to receive rays of light incident on and focused by the microlens.

2. The depth pixel of claim 1, further comprising:
a substrate having an upper portion at which the photoelectric element is disposed; and
a wiring section interposed between the substrate and the microlens, the wiring section including metal wirings all of which are located outside the beam of focused light produced and transmitted by the microlens.

3. The depth pixel of claim 2, further comprising a planarization layer interposed between the wiring section and the microlens and having a flat upper surface against which the microlens is disposed.

4. The depth pixel of claim 3, wherein the planarization layer is a layer of material selected from the group consisting of acrylic and epoxy materials.

5. The depth pixel of claim 2, further comprising an infrared (IR) filter interposed between the wiring section and the microlens.

6. The depth pixel of claim 1, wherein the diameter of the microlens is in a range of from 10 μm±1 μm to 99±1 μm.

7. A depth sensor comprising:
an array of depth pixels, each of which comprises a microlens of photoresist that focuses rays of light incident thereon, and a photoelectric element that converts light received thereby to electric charges, each photoelectric element of the array of depth pixels being positioned relative to a respective microlens in the array so as to receive rays of light incident on and focused by the respective; and
a processor operatively connected to the array of depth pixels and configured to calculate a distance between a target and the depth sensor based on signals output by the array of depth pixels.

8. The depth sensor of claim 7, in combination with a color image sensor configured to generate information on the color of the target.

9. The depth sensor of claim 7, further comprising a light source that illuminates the target.

10. The depth sensor of claim 9, further comprising a lens module having a converging lens, and wherein the array of depth pixels is part of a semiconductor chip, the chip is disposed in the lens module such that light transmitted by the converging lens is incident on the array of depth pixels, and the light source is integral with the lens module.

11. The depth sensor of claim 7, wherein the diameter of each said microlens is in a range of from 10 μm±1 μm to 99±1 μm.

12. The depth sensor of claim 7, wherein the height of each said microlens is in a range of 0.1 μm±0.01 μm to 9.9 μm±0.01 μm.

\* \* \* \* \*